United States Patent
McLean et al.

(10) Patent No.: US 11,476,641 B1
(45) Date of Patent: Oct. 18, 2022

(54) WINDOW FOR LASER PROTECTION

(71) Applicant: MAC THIN FILMS, INC., Santa Rosa, CA (US)

(72) Inventors: David McLean, Santa Rosa, CA (US); Amethyst Radcliffe, Santa Rosa, CA (US)

(73) Assignee: MAC THIN FILMS, INC., Santa Rose, CA (US)

( * ) Notice: Subject to any disclaimer, the term of this patent is extended or adjusted under 35 U.S.C. 154(b) by 292 days.

(21) Appl. No.: 16/907,687

(22) Filed: Jun. 22, 2020

Related U.S. Application Data

(60) Provisional application No. 62/866,606, filed on Jun. 25, 2019.

(51) Int. Cl.
| H01S 5/00 | (2006.01) |
| H01S 5/068 | (2006.01) |
| H01S 5/02257 | (2021.01) |
| G01S 7/491 | (2020.01) |
| H01S 3/034 | (2006.01) |

(52) U.S. Cl.
CPC ...... *H01S 5/06825* (2013.01); *H01S 5/02257* (2021.01); *G01S 7/491* (2013.01); *H01S 3/0346* (2013.01)

(58) Field of Classification Search
CPC . H01S 5/06825; H01S 5/02257; H01S 3/0346
See application file for complete search history.

(56) References Cited

U.S. PATENT DOCUMENTS

| 4,181,774 | A | | 1/1980 | Wendt et al. |
| 4,268,711 | A | | 5/1981 | Gurev |
| 4,361,114 | A | | 11/1982 | Gurev |
| 4,970,376 | A | | 11/1990 | Mellor et al. |
| 5,724,177 | A | * | 3/1998 | Ellis, Jr. ............... G02F 1/157 359/275 |
| 6,490,381 | B1 | * | 12/2002 | Adair ..................... G02F 1/21 385/16 |
| 7,162,141 | B1 | * | 1/2007 | Takano ................ G02B 1/116 385/147 |
| 7,964,788 | B2 | * | 6/2011 | den Boer ............ H01L 31/056 136/265 |
| 9,862,640 | B2 | * | 1/2018 | Pfaff ................. C03C 17/3417 |
| 10,317,534 | B2 | | 6/2019 | Eshel et al. |

(Continued)

FOREIGN PATENT DOCUMENTS

EP 753762 A1 1/1997

*Primary Examiner* — Kinam Park
(74) *Attorney, Agent, or Firm* — Edward S. Sherman

(57) ABSTRACT

A window material for protecting near infrared light emitting lasers and or detectors is coated with a conductive coating that reduces the reflection at the wavelengths and angles of incidence of interest. The conductive coating allows the window to be heated by applying a bias across connected electrodes to remove or prevent the condensation of liquid water and the buildup of ice. The conductive material in the coating has some optical absorption in the hear infrared region of about 800 to 1600 nm, which in combination with multiple intervening dielectric layers also allows the transmission of 90% of the light while obtaining a resistance of less than about 30 Ohms-square. The coating reduces reflection loses from the window, without decreasing transmission by more that about 10%.

20 Claims, 10 Drawing Sheets

(56) References Cited

U.S. PATENT DOCUMENTS

| | | | |
|---|---|---|---|
| 2010/0035082 A1* | 2/2010 | Hitosugi | C30B 23/066 428/697 |
| 2010/0079844 A1* | 4/2010 | Kurman | E06B 9/24 359/266 |
| 2012/0223302 A1* | 9/2012 | Yukinobu | C09D 1/00 427/535 |
| 2012/0295120 A1* | 11/2012 | Nagamoto | C08J 7/0427 428/447 |
| 2012/0301710 A1* | 11/2012 | Nagamoto | C23C 14/027 428/447 |
| 2018/0313979 A1* | 11/2018 | Miyashita | G02B 26/085 |
| 2018/0316160 A1* | 11/2018 | Raring | H01S 5/3203 |

* cited by examiner

Wavelength, nm

WINDOW FOR LASER PROTECTION

CROSS REFERENCE TO RELATED APPLICATIONS

The present application claims the benefit of priority to the U.S. provisional patent application of the same title that was filed on Jun. 25, 2019, having Ser. No. 62/866,606, which is incorporated herein by reference.

BACKGROUND OF INVENTION

The field of inventions is protective components for optical systems, and more particularly a window for the protection of laser devices that are subjected to external environments.

LIDAR an acronym for Light Detection and Ranging. A LIDAR system deploys lasers to emit pulses of light toward a static or moving object. The reflected or scattered pulses are then received by a detector and converted to electrical signals for decoding to determine the time of flight of the pulses, and hence the distance from the object, based on the known path distance of the laser source and detector.

Lasers for LIDAR systems typically provide a output of coherent light over a very narrow range of wavelength, a few nanometer, in the near infrared range (NIR), or at least greater than 700 nanometer (nm), well into the infrared range such as for example up to about 1600 nm. The desired wavelengths for LIDAR sensing are in regions of the solar spectrum with the lowest emission to minimize background signal that need to be separated out in processing the digital signals of the detector output.

However, use of LIDAR in automobiles or other vehicles may be limited due to weather conditions like fog, rain and snow that can scatter the emitted laser beam, as well as re-scatter or deflect return signal form the object.

The use of LIDAR for range sensing to provide automatic braking of automobiles is disclosed in U.S. Pat. No. 10,315,649B2 issued to Sneha Kadetotad on Jun. 11, 2019. A LIDAR system for vehicles may use multiple beams, such as is disclosed in U.S. Pat. No. 10,302,746B2, which issued to James Thomas O'Keeffe on May 28, 2019. U.S. Pat. No. 10,302,749B2 which issued to Pierre-Yves Droz et al. May 28, 2019 for "LIDAR optics alignment systems and methods" discloses other aspects of LIDAR technology.

As disclosed in U.S. Pat. No. 10,267,898B2 which issued to Scott R. Campbell et al. on Apr. 23, 2019 for a "Scan patterns for lidar systems", in order to detect and determine the range of an object in a vehicles potential or near path the laser beam is scanned to cover a spatial range. A laser or light source emitted beam is deflected by a scanning optical system to provide a first scan pattern and the same or different scan system can provide a second scan pattern, which can be at least partially overlap with the first scan pattern. The LIDAR system can also include an enclosure to contain the light source, the first LIDAR sensor, and the second LIDAR sensor.

U.S. Pat. No. 10,317,534 B2, which issued to Eschel et al. on Jun. 11, 2019 for "ADAPTIVE NOISE MITIGATION FOR DIFFERENT PARTS OF THE FIELD OF VIEW" describes another LIDAR system with a scanning optical system for a wide field of view.

U.S. Pat. Nos. 10,267,898B2; 10,302,746B2; 10,302,749B2; 10,315,649B2 and 10,317,534 B2 are all incorporated herein by reference.

As the laser, detector optics and related components need environmental protection, they are mounted in a sealed compartment having an optically transparent window. The window must be transparent at the laser emission wavelength. It is also highly desirable to prevents the build-up of condensation and ice by heating the window. When the window is electrically conductive or has an electrically conductive coating it can be heated by applying a bias through electrodes contacting the coating to generate power. Such conductive transparent thin film heaters have been used for the windows of aircrafts. They frequently deploy a conductive film of an indium oxide, which depending on the dopant concentration and thickness can vary in conductivity to reach levels suitable to generate sufficient power per unit area to evaporate moisture, frost and ice, as well as prevent the build-up thereon.

The level of conductivity desired will vary with the voltage of the power source. For automobiles, this is a 12V car battery, although trucks and electric vehicles may have higher voltage source available. It is generally desirable that a transparent conductive coating have a sheet resistance of 10-50 ohm/sq. If the resistance is higher, then a typical automotive 12V battery will provide less current and ($i=12V/R$) and the heat output ($P=i \times 12V$) will be too low to melt ice.

LIDAR system may use multiple beams that exit the same window at different angles, and the detector(s) may be configured to receive light scattered or reflected off objects at different angle.

It would be advantageous to provide protective windows for LIDAR systems that are transparent at the laser emission wavelengths. However, in order to accept the broadest range of scattered light returned from one or more lasers, any optical coating on the window should not become highly reflective at larger ranges of angle of incidence.

Ideally, such windows that incorporate a conductive coating or layer and preserves a large sensing range by reducing reflection from the window should also avoid the conductive coating absorbing light at the laser emission wavelengths taking into account expected angle of incidence.

The above and other objects, effects, features, and advantages of the present invention will become more apparent from the following description of the embodiments thereof taken in conjunction with the accompanying drawings

SUMMARY OF INVENTION

In the present invention, the first object is achieved by providing a coated transparent substrate having a conductive multi-layer coating on at least one surface to reduce reflectance, the multi-layer coating comprising a first partially absorbing transparent conductive layer having a first surface and a second surface opposite the first surface, wherein the first surface is disposed over a first surface of the substrate, a first dielectric layer having a first surface and a second surface opposite the first surface, wherein the first surface is disposed over the second surface of the first partially absorbing transparent conductive layer, a second partially absorbing transparent conductive layer having a first surface and a second surface opposite the first surface, wherein the first surface is disposed over the second surface of the first dielectric layer, a second dielectric layer having a first surface and a second surface opposite the first surface, wherein the first surface is disposed over the second surface of the second partially absorbing transparent conductive layer, wherein the first and second dielectric layer have a refractive index at a first wavelength between about 700 to 1700 nm that is less than about 1.45, at least one of the first and second partially absorbing transparent conductive layer is an oxide of tin and titanium in which the titanium comprises less an about 5 atomic percent of the layer, and wherein at least one of the first and second partially absorbing transparent conductive layers has a real portion of the refractive index that is less than 1.8 at the first wavelength and an imaginary portion of the refractive index that is less than about 0.18 at the first wavelength, and the conductive multi-layer coating has a sheet resistance of less than 30 ohms per square.

Another object is achieved by providing such a coated transparent substrate having a conductive multi-layer coating on at least one surface to reduce reflectance wherein when the first wavelength is between about 700 to about 1300 nm the extinction coefficient of the partially absorbing transparent conductive layer is less than about 0.04 and real part of the refractive index thereof is greater than about 1.5.

Another object is achieved by providing a coated transparent substrate having a conductive multi-layer coating on at least one surface to reduce reflectance, the multi-layer coating comprising a first partially absorbing transparent conductive layer having a first surface and a second surface opposite the first surface, wherein the first surface is disposed over a first surface of the substrate, a first dielectric layer having a first surface and a second surface opposite the first surface, wherein the first surface is disposed over the second surface of the first partially absorbing transparent conductive layer, a second partially absorbing transparent conductive layer having a first surface and a second surface opposite the first surface, wherein the first surface is disposed over the second surface of the first dielectric layer, a second dielectric layer having a first surface and a second surface opposite the first surface, wherein the first surface is disposed over the second surface of the second partially absorbing transparent conductive layer, wherein the first and second dielectric layer have a refractive index between about 800 to 1600 nm that is less than about 1.45, at least one of the first and second partially absorbing transparent conductive layer is an oxide of tin and titanium in which the titanium comprises less an about 5 atomic percent of the layer, and wherein the coated transparent substrate has an internal transmission at a first wavelength between about 700 to 1700 nm that is at least 90% and a reflectivity at the first wavelength that is less than 2% at between 0 to 10 degrees from normal incidence, wherein at least one of the first and second partially absorbing transparent conductive layers has a real portion of the refractive index that is less than 1.8 at the first wavelength and an imaginary portion of the refractive index that is less than about 0.18 at the first wavelength, and the conductive multi-layer coating has a sheet resistance of less than 30 ohms per square.

Another object is achieved by providing a coated transparent substrate having a conductive multi-layer coating on at least one surface to reduce reflectance, the multi-layer coating comprising at least one first partially absorbing transparent conductive layer having a first surface and a second surface opposite the first surface, wherein the first surface is disposed over a first surface of the substrate, a first dielectric layer having a first surface and a second surface opposite the first surface, in which the refractive index between about 800 to 1600 nm is less than about 1.45, wherein the first surface is disposed over a first surface of the substrate, a second dielectric coating layer having a first surface and a second surface opposite the first surface, in which the refractive index between about 800 to 1600 nm is greater than about 1.9, wherein the first surface is disposed over a first surface of the substrate, wherein the first partially absorbing transparent conductive layer has a real portion of the refractive index that is less than 1.8 at a first wavelength and an imaginary portion of the refractive index that is less than about 0.008 at the first wavelength, in which the first wavelength is between about 800 to 1600 nm, wherein the coated transparent substrate has an internal transmission at the first wavelength that is at least 90% and a reflectivity at the first wavelength that is less than 2% at between 0 to 10 degrees from normal incidence.

Another object is achieved by providing such a coated transparent substrate having a conductive multi-layer coating on at least one surface to reduce reflectance wherein the second dielectric coating layer is deposited on the first surface of the substrate.

Another object is achieved by providing any such coated transparent substrate having a conductive multi-layer coating on at least one surface to reduce reflectance wherein the first dielectric layer is deposited on the third dielectric coating layer.

Another object is achieved by providing any such coated transparent substrate having a conductive multi-layer coating on at least one surface to reduce reflectance further comprising one or more additional dielectric layers having a refractive index greater than about 1.9 between about 800 to 1600 nm.

Another object is achieved by providing any such coated transparent substrate having a conductive multi-layer coating on at least one surface to reduce reflectance wherein the partially absorbing transparent conductive layer is disposed between a pair of dielectric layers in which each dielectric layer of the pairs has a refractive index greater than about 1.9 between about 800 to 1600 nm.

Another object is achieved by providing any such coated transparent substrate having a conductive multi-layer coating on at least one surface to reduce reflectance wherein when the first wavelength is between about 700 to about 1300 nm the extinction coefficient of the partially absorbing transparent conductive layer is less than about 0.04 and real part of the refractive index is greater than 1.5 and the conductive multi-layer coating has a sheet resistance of less than 30 ohms per square.

Another object is achieved by providing any such coated transparent substrate having a conductive multi-layer coating on at least one surface to reduce reflectance wherein when the first wavelength is between about between about 1200 nm to about 1700 nm the extinction coefficient of the partially absorbing transparent conductive layer is less than about 0.18 and real part of the refractive index is greater than 0.8 and the conductive multi-layer coating has a sheet resistance of less than 30 ohms per square.

Another object is achieved by providing any such coated transparent substrate having a conductive multi-layer coating on at least one surface to reduce reflectance wherein when the first wavelength is between about between about 1200 nm to about 1700 nm the extinction coefficient of the partially absorbing transparent conductive layer is less than about 0.18 and real part of the refractive index thereof is greater than 0.8.

Another aspect of the invention is a process for depositing a partially absorbing transparent conductive layer on a substrate, the process comprising the steps of providing a coating chamber configured with a plasma activated source (PAS), mounting a substrate in the coating chamber, evacuating the coating chamber, admitting oxygen to and energizing the PAS, directing a vapor containing indium and a dopant at the substrate, wherein a partially absorbing transparent conductive layer is deposited on the substrate that has a sheet resistance of less than about 30 ohms per square and an internal transmission at a wavelength between about 700 to 1700 nm that is at least 90%.

Another aspect of the invention is such a process for depositing a partially absorbing transparent conductive layer on a substrate wherein the partially absorbing transparent conductive layer has an internal transmission that is at least 80% for any wavelength between about 900 nm to 1600 nm.

Another aspect of the invention is any such process for depositing a partially absorbing transparent conductive layer on a substrate wherein the dopant is titanium.

Another aspect of the invention is any such process for depositing a partially absorbing transparent conductive layer on a substrate wherein over the wavelength range of 700 to 1700 nm the partially absorbing transparent conductive layer has an extinction coefficient that is less than about 0.18 and real part of the refractive index is less than 1.8.

Another aspect of the invention is any such process for depositing a partially absorbing transparent conductive layer on a substrate further comprising a step of depositing at least one dielectric layer on a first portion of the partially absorbing transparent conductive layer and then deposited a second portion of the partially absorbing transparent conductive layer.

Another aspect of the invention is any such process for depositing a partially absorbing transparent conductive layer on a substrate further comprising a step of depositing at least one dielectric layer over the substrate before depositing the partially absorbing transparent conductive layer over the at least one dielectric layer.

Another aspect of the invention is any such process for depositing a partially absorbing transparent conductive layer on a substrate wherein the indium and the dopant are one of sputtered and evaporated and the substrate is heated to at least 200° C.

Another aspect of the invention is any such process for depositing a partially absorbing transparent conductive layer on a substrate wherein the indium and the dopant are each directed as a separate vapor from a separate source at the substrate.

Another aspect of the invention is any such process for depositing a partially absorbing transparent conductive layer on a substrate wherein the indium is directed as a vapor at the substrate from one of a metallic and at least partially oxidized state at the substrate.

The above and other objects, effects, features, and advantages of the present invention will become more apparent from the following description of the embodiments thereof taken in conjunction with the accompanying drawings.

DETAILED DESCRIPTION

Figure 1:
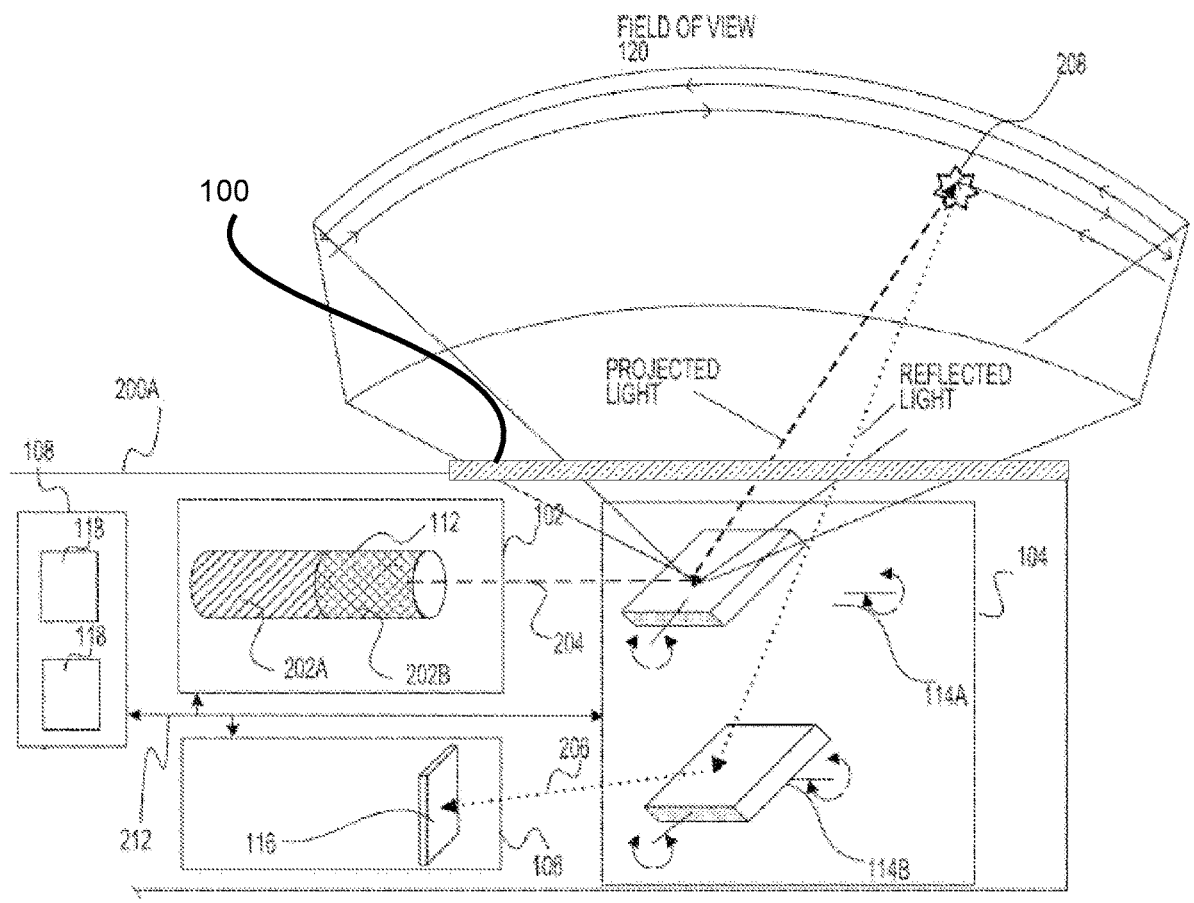
FIG. 1 is a schematic diagram of a potential LIDAR system that may deploy the inventive window.

Referring to FIGS. 1 through 10, wherein like reference numerals refer to like components in the various views, there is illustrated therein a new and improved window for laser protection, generally denominated 100 herein.

FIG. 1 illustrate the placement of the window 100 in a prior art LIDAR system disclosed in U.S. Pat. No. 10,317,534 B2, which it issued on Jun. 11, 2019 to Eshel, R. et al., and is incorporated herein by reference. Only the system is admitted as prior art, as it is merely exemplary of how the inventive window 100 might be used.

Figure 2:
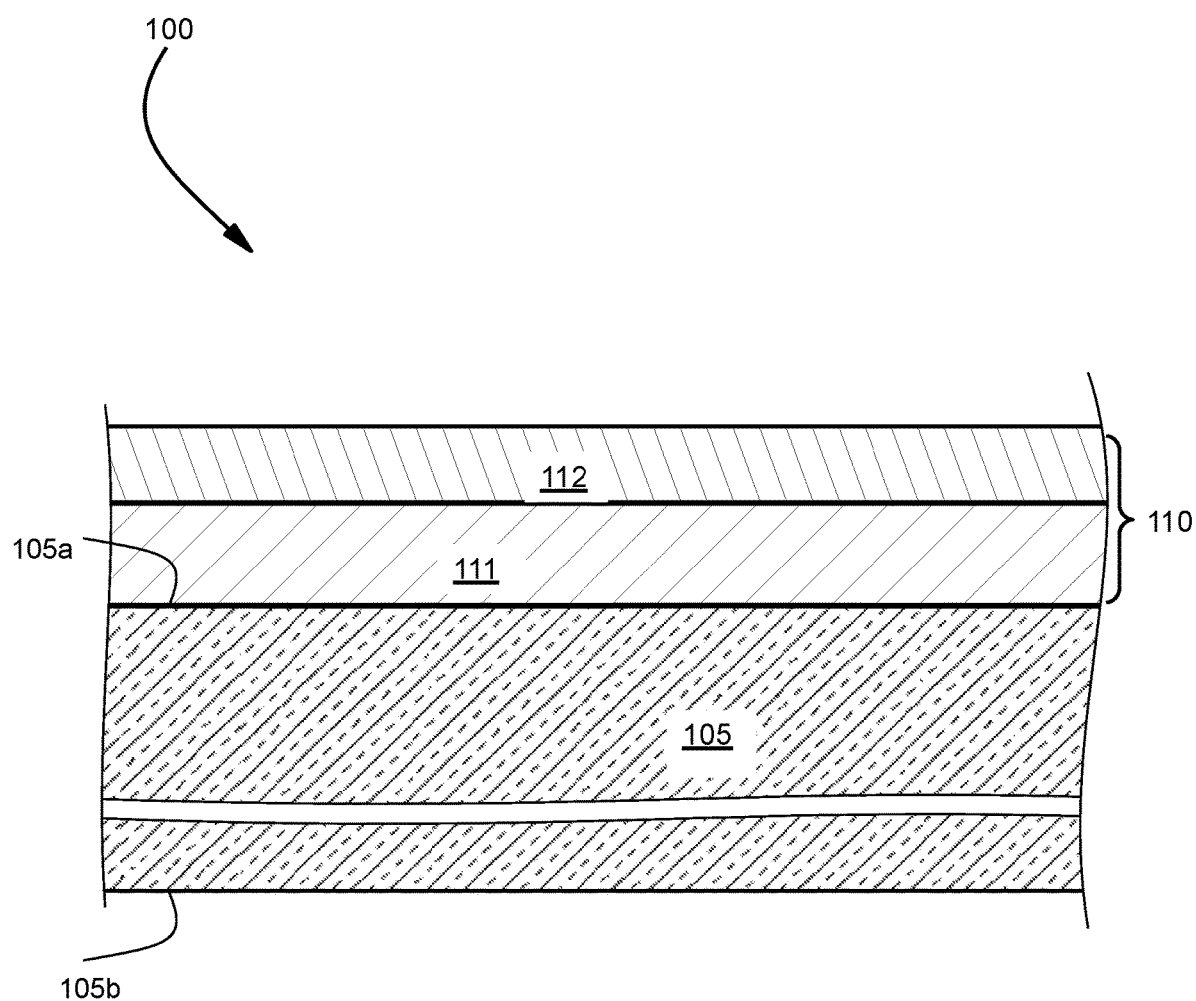
FIG. 2 is a section view of a portion of the window in FIG. 1 in a first embodiment of the invention.

In accordance with an embodiment of the present invention as illustrated in FIG. 2, the window for laser protection 100 comprises a coated transparent substrate 105 having a conductive multi-layer coating 110 on at least one surface 105a to reduce reflectance. The conductive multi-layer coating 110 may itself comprise a partially absorbing transparent conductive layer (PATCL) 111 having a first surface and a second surface opposite the first surface, wherein the first surface is disposed over a first surface 105a of the substrate 105. The multi-layer coating 110 may also comprise a first dielectric layer 112 having a first surface and a second surface opposite the first surface, wherein the first surface is disposed over the second surface of the partially absorbing transparent conductive layer 111. The absorbing transparent conductive layer 111 is an oxide of tin and titanium (InTiO) in which the titanium comprises less an about 5 atomic percent of the layer. This may provide the coated transparent substrate 105 with an internal transmission at a first wavelength between about 800 to 1600 nm that is at least 90%.

It should be understood that in the context of the various embodiments of the window for laser protection 100 preferably has an addition multi-layer coating (not shown) on the surface 105b that is opposite the surface 105a of substrate 105 with the conductive multi-layer coating 110. As this application is directed to the conductive multi-layer coating 110 the term "internal transmission" means the transmission through the substrate 105 and multi-layer coating 105 without the effect of any reflection loss at the interface of the coated window 100 with air, that is at the surface 105b. If another coating on surface 105b is a perfect anti-reflective coating for the wavelength and angle of incidence of measurement, then the measured transmission of a reference beam of light and the internal transmission are the same. If the surface 105b is uncoated, then the reflection at surface 105b, if for example being about 4.5%, would be subtracted from the measured transmission to determine the internal transmission.

The partially absorbing transparent conductive layer 111 may have a real portion of the refractive index that is less than about 1.8 at the first wavelength and an imaginary portion of the refractive index, or extinction coefficient, that is preferably less than about 0.18 at the first wavelength. The conductive multi-layer coating 110 preferably has a sheet resistance of less than 30 ohms per square.

More preferably when the first wavelength is between about 700 to about 1300 nm the extinction coefficient of the partially absorbing transparent conductive layer 111 is less than about 0.04 and real part of the refractive index is greater than 1.5.

It is also preferable that when the first wavelength is between about 1200 nm to about 1700 nm the extinction coefficient of the partially absorbing transparent conductive layer 111 is less than about 0.18 and real part of the refractive index is greater than about 0.8.

Figure 3:
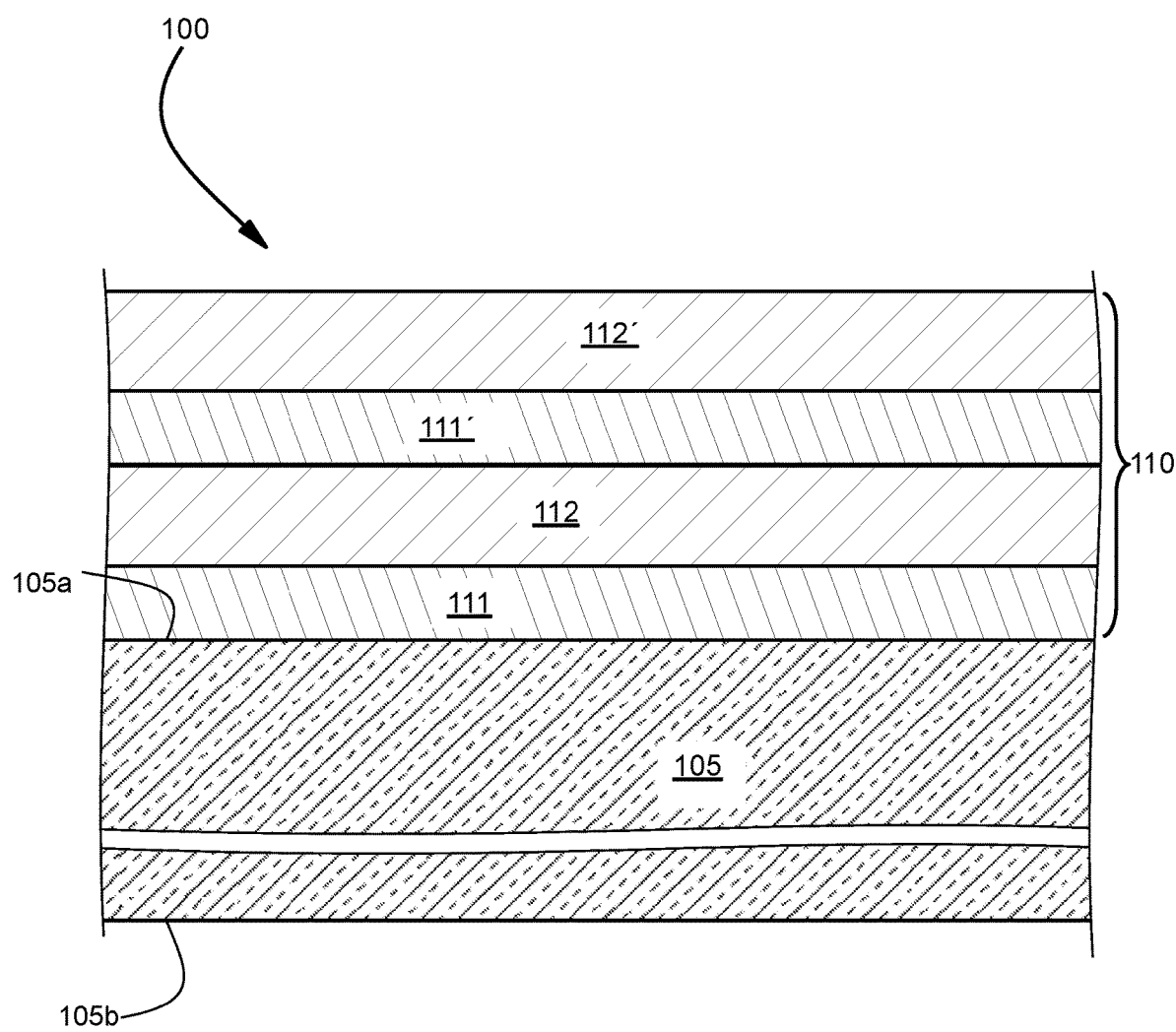
FIG. 3 is a section view of a portion of the window in FIG. 1 in a second embodiment of the invention.

In accordance with another embodiment of the present invention, illustrated in FIG. 3, the window for laser protection 100 comprises a coated transparent substrate 105 that has a conductive multi-layer coating 110 on at least one surface 105a to reduce reflectance. The multi-layer coating 110 may comprise a first partially absorbing transparent conductive layer 111 having a first surface and a second surface opposite the first surface, wherein the first surface is disposed over a first surface of the substrate 105, a first dielectric layer 112 having a first surface and a second surface opposite the first surface, wherein the first surface is disposed over the second surface of the first partially absorbing transparent conductive layer, second partially absorbing transparent conductive layer 111' having a first surface and a second surface opposite the first surface, wherein the first surface is disposed over the second surface of the first dielectric layer, and a second dielectric layer 112' having a first surface and a second surface opposite the first surface, wherein the first surface is disposed over the second surface of the second partially absorbing transparent conductive layer. The first dielectric layer 112 and second dielectric layer 112' have a refractive index between about 700 to 1700 nm that is less than about 1.45. Further, at least one of the first and second partially absorbing transparent conductive layer 111 and 111' is an oxide of tin and titanium in which the titanium comprises less an about 5 atomic percent of the layer. This provides the coated transparent substrate 105 with an internal transmission at a first wavelength between about 700 to 1700 nm that is at least 90% and a reflectivity at the first wavelength that is less than 2% at between 0 to 10 degrees from normal incidence.

Another aspect of the invention is a method for depositing the layers 111, 112, 111' and 112' on a substrate 105, particularly for depositing the oxide of tin and titanium 111 to achieve a low electrical resistivity, a sheet resistance of less than 30 ohms per square, and window has an internal transmission at a first wavelength between about 800 to 1600 nm that is at least 90%.

The ability to achieve these objectives at the very narrow laser wavelength emission band of a few nm in the range of about 700 to 1700 nm depends on the optical properties of the transparent conductive oxide (TCO).

Most oxides of indium start to absorb light in the NIR (greater than about 680 nm) as they become more conductive. The conductivity, the inverse of resistivity, is a function of the charge carrier density and mobility. Charge carrier mobility is diminished by the defects from an otherwise perfect crystal, as grain boundaries, dislocations and lattice defects, as well as interstitials and vacancies, as well as impurities in the actual material reduce charge carrier mobility such as by scattering. The charge carrier density is influenced by the dopant characteristics and the stoichiometry in complex ways. If the dopant has a large atomic radius, it can increase scattering and thus decrease carrier mobility. Even though the concentration of such dopants may increase the number of charge carriers, the decreased mobility from scattering may results in an increased resistivity, rather than decreased resistivity. Thin films are largely deposited under non equilibrium conditions, and may be amorphous, nano-crystalline or microcrystalline, as well as vary in source roughness. Such differences may affect charge carrier density and mobility in ways that are not readily predictable purely from the composition or properties from a different deposition process.

It has been discovered that when indium oxide is doped with titanium by a preferred physical vapor deposition process, the resulting thin films have a desirable combination of resistivity and refractive index, it was possible to achieve both the desired electrical and optical performance objectives for LIDAR applications by providing inventive thin film coating constructions of TABLE I, II and III, are exemplary for laser emissions of 950 and 1550 nm.

TABLES I, II and III provide representative compositions, optical parameters and the physical thickness (n) to achieve the desired low reflectivity at the indicated wavelength in nm. FWOT is the full wave optical thickness of the layer in nm, which takes into account the laser emission wavelength (λ) and the refractive index (n) at the wavelength λ according to the equation (n×d)/λ. The values of the real (n) and imaginary (k) part of the refractive index are provided for each layer composition in the coating designs.

TABLE I

Conductive Multilayer Coating Layers for low reflectance at 950 nm.

| λ = 950 nm Band Layer composition | | n | k | FWOT | Physical Thickness, d (nm) |
|---|---|---|---|---|---|
| second dielectric layer | MgF$_2$ | 1.3803 | 0 | 0.269604 | 175.79 |
| Second (PATCL) | InTiO | 1.8017 | 0.00906 | 0.161493 | 80.67 |
| First dielectric layer | MgF$_2$ | 1.3803 | 0 | 0.056844 | 37.06 |
| first partially absorbing transparent conductive layer (PATCL) | InTiO | 1.8017 | 0.00906 | 0.081823 | 40.87 |
| Substrate | GLASS | | | | |
| Total thickness of PATCL | | | | | 121.5 nm |

TABLE II

Conductive Multilayer Coating Layers for low reflectance at 1550 nm.

| 1550 nm Band Layer Composition | | n | k | FWOT | d (nm) |
|---|---|---|---|---|---|
| second dielectric layer | MgF$_2$ | 1.3803 | 0 | 0.139484 | 156.63 |

TABLE II-continued

Conductive Multilayer Coating Layers for low reflectance at 1550 nm.

| | 1550 nm Band Layer Composition | n | k | FWOT | d (nm) |
|---|---|---|---|---|---|
| Second (PATCL) | InTiO | 1.22735 | 0.06934 | 0.079184 | 100 |
| First dielectric layer | MgF$_2$ | 1.3803 | 0 | 0.013358 | 15 |
| first partially absorbing transparent conductive layer (PATCL) | InTiO | 1.22735 | 0.06934 | 0.011878 | 15 |
| Substrate | GLASS | | | | |
| | Total thickness of PATCL | | | | 115 nm |

Figure 4A:
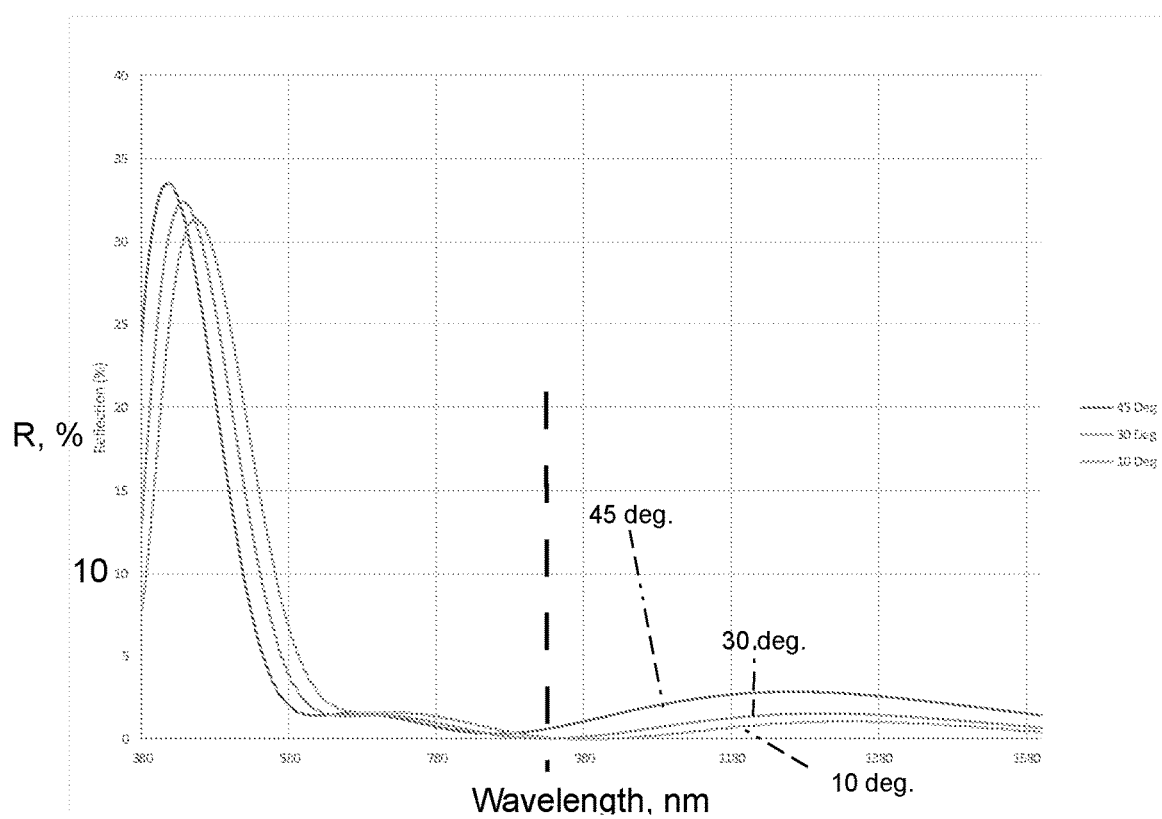
FIGS. 4A and 4B are plots of the optical reflectivity and transmission characteristics as a function of wavelength for the optical design in Table I.
Figure 4B:
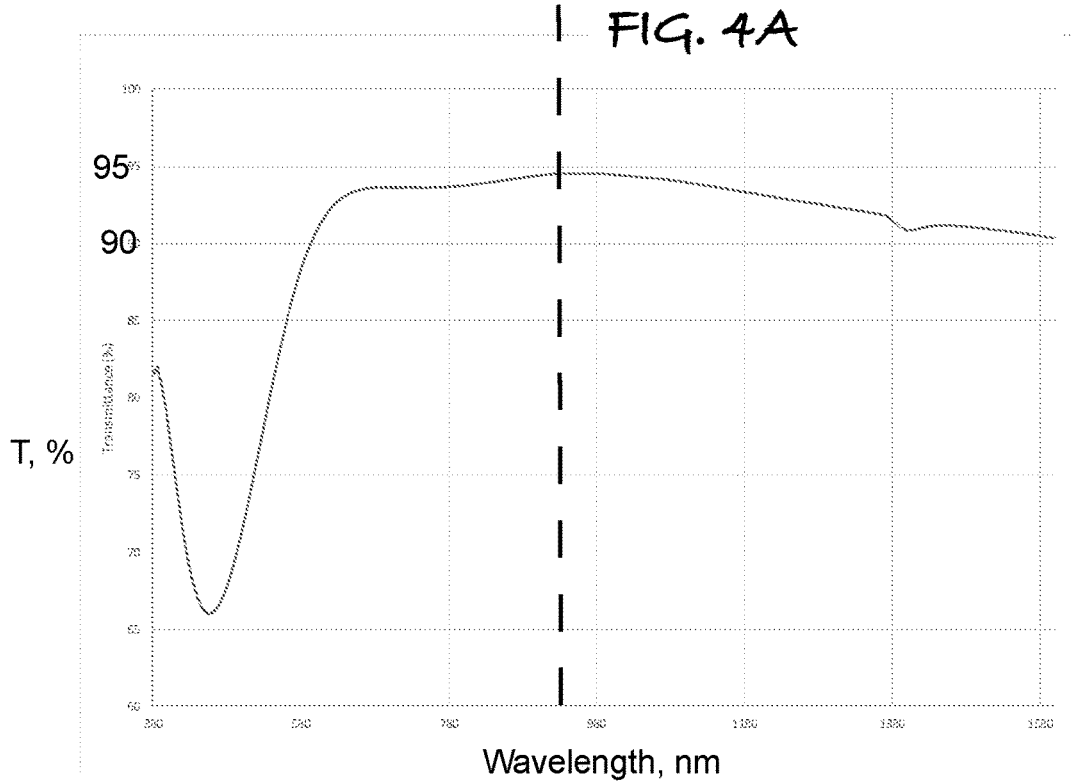
Figure 5A:
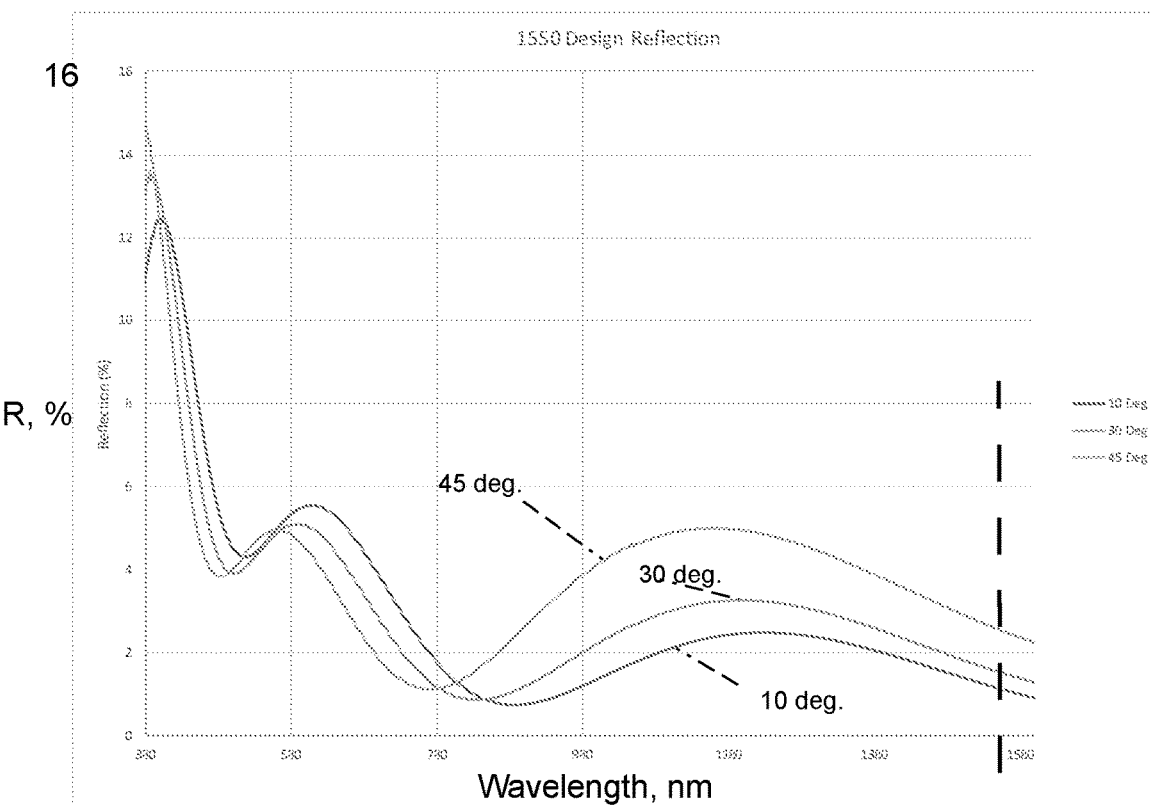
FIGS. 5A and 5B are plots of the optical reflectivity and transmission characteristics as a function of wavelength for the optical design in Table II
Figure 5B:
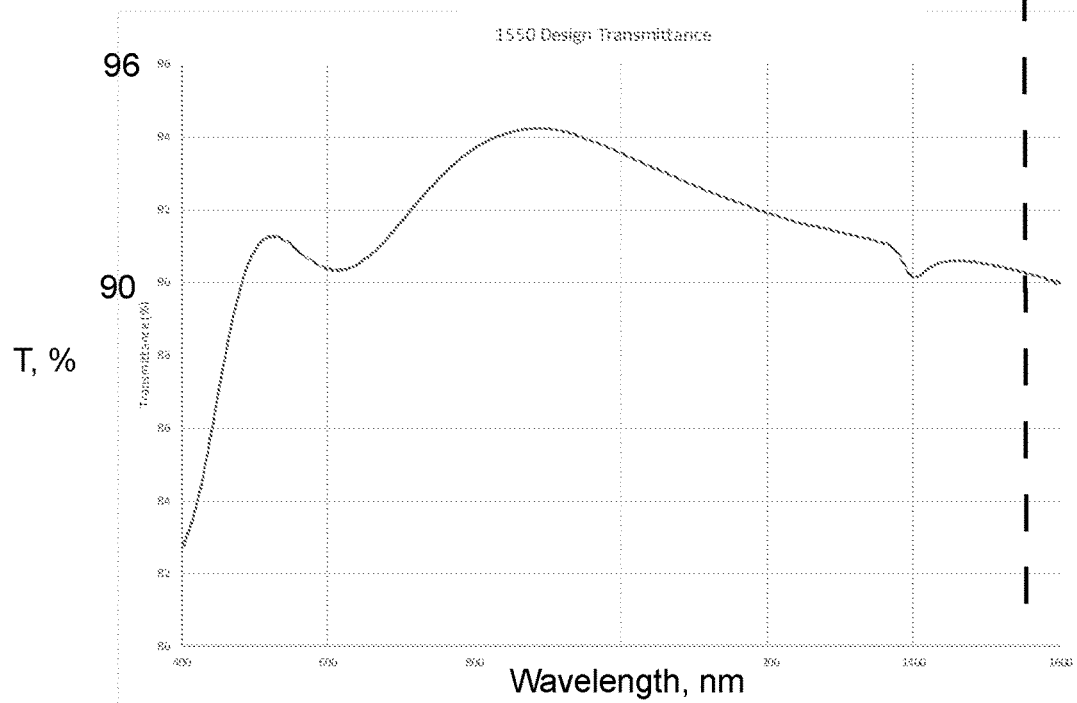

The reflectance and transmission spectra of the coating design of TABLE I is provided in FIGS. 4A and 4B respectively. The reflectance and transmission spectra of the coating design of TABLE II is provided in FIGS. 5A and 5B respectively. The low resistivity of less than about 30 ohms-square is achieved with a total thickness of the TCO of about 100 nm, slightly less than the designs in Tables I and II to further increase optical transmission of the multilayer coating 110, with the transmission at 1550 nm being greater than 97% and the reflectivity at 1550 nm being less than 0.25%.

It should be appreciated that variants of these embodiments may deploy other dielectrics than magnesium fluoride (MgF$_2$), such as silicon dioxide (SiO$_2$). Also, the first and second dielectrics layers may have the same composition, or have different compositions, as for example one layer being MgF$_2$ and the other being SiO$_2$.

The total thickness of the transparent conductive layers is preferably less than about 120 nm. At least one of the first and second partially absorbing transparent conductive layers consists essentially of tin, titanium and oxygen. In optical designs using a single transparent conductive layer the thickness may need to be about the same or greater, depending on the resistivity.

It should be noted that at the first wavelength at least one of the first and second partially absorbing transparent conductive has a real part of the refractive index that is less than the refractive index of the first and second dielectric layers.

Alternatively, at the desired range of conductivity, transmission and reflectivity in the Infrared range can be obtained using 3 different materials in the coating, per the coating design of TABLE III, which achieves a low reflectivity at 1550 nm.

TABLE III

Conductive Multilayer Coating Layers for low reflectance at 1550 nm.

| AIR | n | k | QWOT | d (nm) |
|---|---|---|---|---|
| MgF$_2$ | 1.3803 | 0 | 0.12675815 | 142.34 |
| Mixed Pr-Ti Oxide | 2.0198 | 0 | 0.61465387 | 471.69 |
| InTiO | 1.22735 | 0.06934 | 0.0807042 | 101.92 |
| Mixed Pr-Ti Oxide | 2.0198 | 0 | 0.19309347 | 148.18 |
| MgF$_2$ | 1.3803 | 0 | 0.23625092 | 265.3 |
| Mixed Pr-Ti Oxide | 2.0198 | 0 | 0.05264728 | 40.4 |
| Substrate | GLASS | | | |
| | Total thickness of PATCL | | | 101.92 nm |

Figure 6:
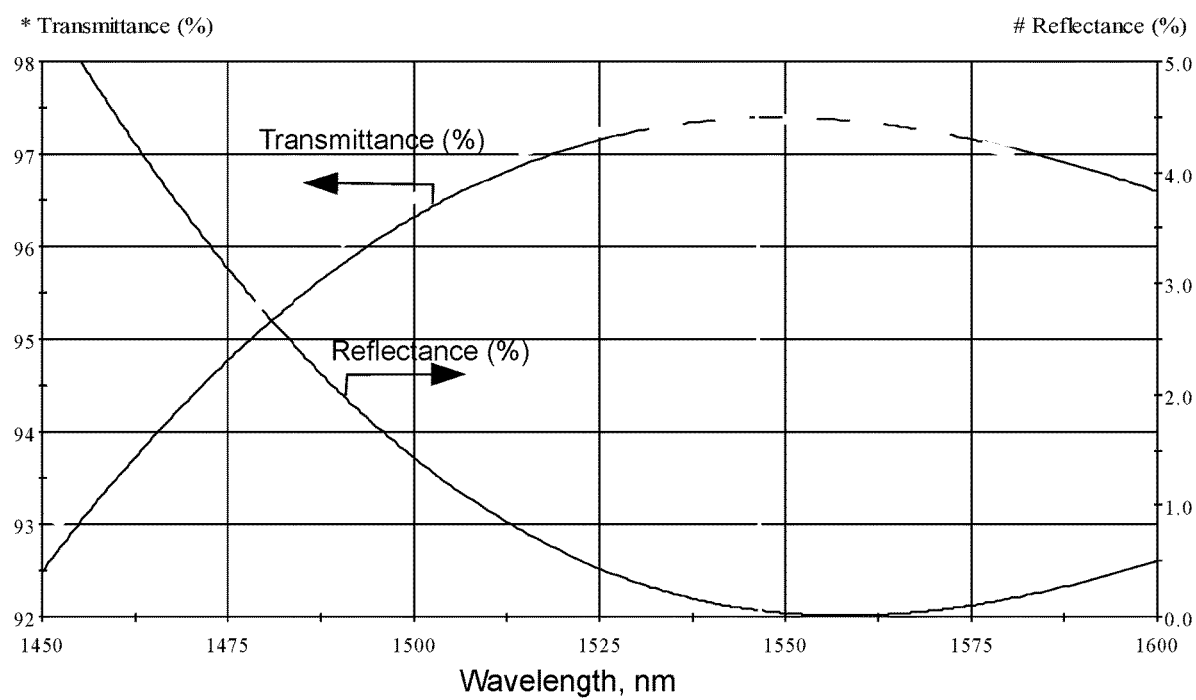
FIG. 6 is a plot of the optical reflectivity and transmission characteristics as a function of wavelength for the optical design in Table III at normal incidence.

FIG. 6 is a plot of the optical reflectivity and transmission characteristics as a function of wavelength for the optical design in Table III at normal incidence.

Mixed Pr—Ti Oxide is a high refractive index material containing praseodymium oxide and titanium dioxide. It should be noted that the Mixed Pr—Ti Oxide is provided in 3 discrete layers that each have a refractive index of greater than about 2. The praseodymium and titanium ratios are about equal on an atomic percent basis, each being fully oxidized to achieve essentially no optical absorption at the laser wavelengths.

It should also be appreciated that the coating design of TABLE III can be modified by substituting different high refractive index dielectric materials for the Mixed Pr—Ti Oxide, provided they have a refractive index of at least about 1.9, such as titanium dioxide, tantalum dioxide, niobium oxide and the like.

It should be appreciated that numerous variants of these embodiments are possible. For example, the first and second dielectric layers can have the same or a different composition. The first and second dielectric layers can each be one of magnesium fluoride (MgF$_2$) and silicon dioxide (SiO$_2$).

It should be understood in the various descriptions of the different embodiments, the layers can be deposited directly on a previous layer, including the substrate 105s, as well as over the previous layer. Depositing over a layer means none, one or more thin intervening layers of another material may be present without detracting from the basic function of the combination, for examples, the MgF$_2$ and SiO$_2$ may be deposited as separate layers to provide the equivalent of a single dielectric layer.

It has been discovered that the combination of using an Plasma Activated Oxygen (PAS) source while heating the substrate 105 to a temperature of at least about 280° C. is effective during the Physical Vapor Deposition (PVD) of titanium doped indium oxide thin films to provide the optical characteristics in Tables I-III, as well as the low resistivity. In a more preferred embodiment this film or layer has about 2 atomic % Titanium but may have less than 1% and up to about 5%.

The PAS source 820 is disclosed U.S. Pat. No. 4,268,711 which issued to Gurev, H. S. on May 19, 1981 and U.S. Pat. No. 4,361,114 which also issued to Gurev, H. S. on Nov. 30, 1982 and are both incorporated herein by reference.

Figure 7:
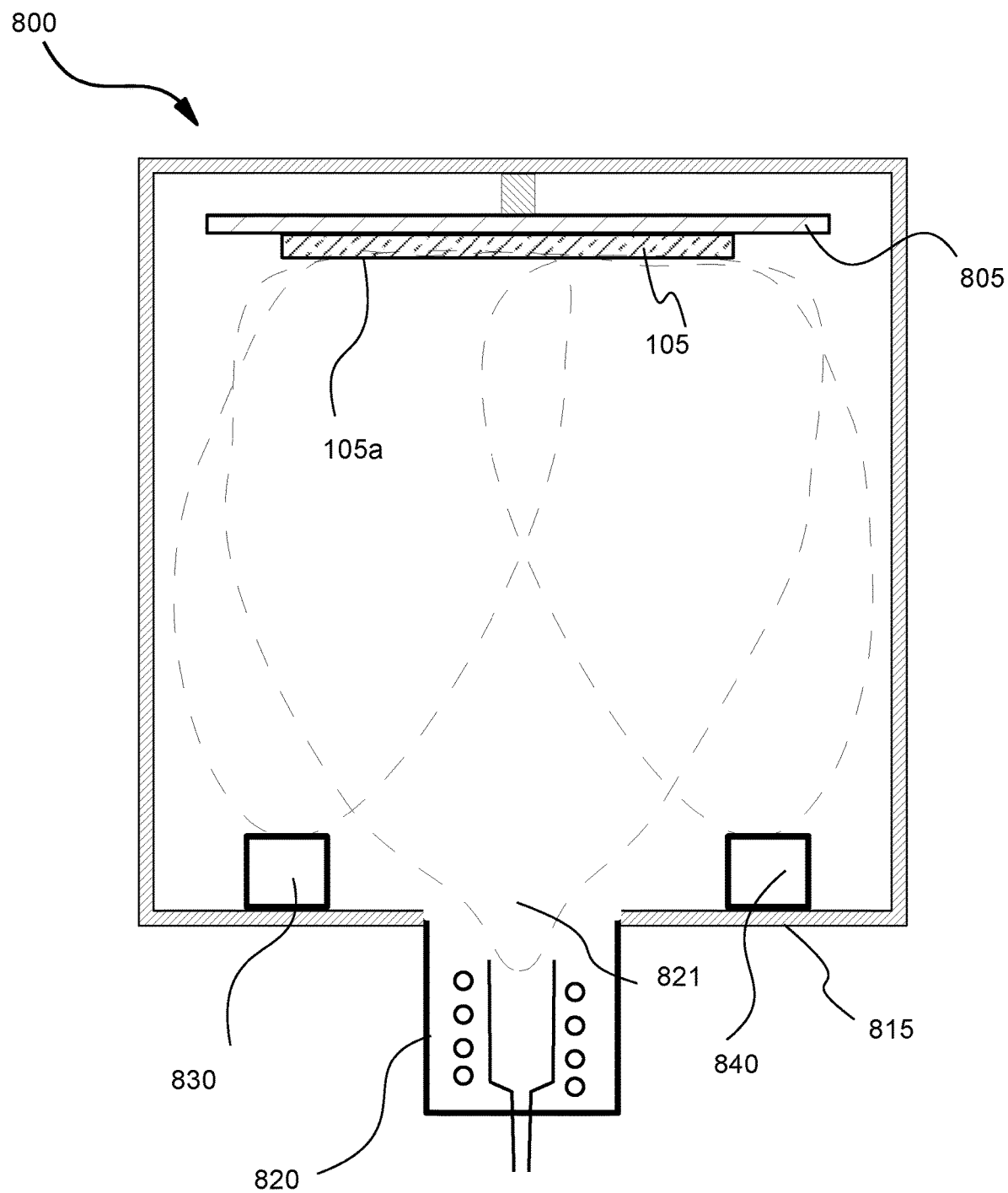
FIG. 7 is a schematic sectional view of a coating chamber using a Plasma Activated Source (PAS) so that oxygen reacts with the metal or metal oxide vapor to form the conductive oxides during deposition.

FIG. 7 illustrates an embodiment of a coating system 800 with a vacuum coating chamber 810 useful for depositing the oxide of tin and titanium and the dielectric layers on the substrate 105 using a PAS source 820. The substrate 105 is heated from either a contacting or emissive heater device in the coating chamber 810. The coating chamber 810 may also be heated. The substrate 105 is preferably rotated in a planetary orbit on rack 805 to obtain a uniform deposition of each coating layer on all the substrates 105 supported by the rack 805. The indium, titanium metal and magnesium fluoride, as well other dielectric materials, such as silicon dioxide, are evaporated from 2 or more sources, such by electron beam heating in vacuum from crucible, or by resistive heating of a metal boat that contains the source material as a metal or oxide. At least some of these materials can be provided in the form of a vapor by sputtering, such as DC magnetron sputtering as metal or by reactive sputtering, as well as RF magnetron sputtering from oxides.

The PAS source 820 is mounted to have an outlet 821 at the bottom 815 of the coating chamber 810 and comprises a core of a high temperature resistive insulating material that is surrounded externally by a coil that is configured to be powered in the radio frequency range. A controlled flow of oxygen is introduced from below the PAS source 820, which when ionized under the influence of the RF field generated when the coil is energized will exit the outlet 821 in a very energized or reactive state. The coil should be energized with respect to the oxygen flow to produce a radio frequency electromagnetic field within the PAS source 820 to create a self-igniting oxygen plasma at an energy that is still insufficient to evaporate the core of the high temperature resistive insulating material.

When these conditions are realized, the source or sources for providing a vapor of at least the indium and dopant, such as the preferred material titanium, are energized to direct metal or metal oxide vapor at the substrate at a rate at which the oxygen plasma can near completely oxidize the metals in each coating layer as they condense on the substrate 105. If the indium and titanium are separately evaporated as pure metal or from an alloy a mixed oxide thin film will also condense on the substrate 105 or the previously deposited coating layer in the optical design. The deposition rates can be will varied to account for the size of the chamber and the type of metal vapor forming source or sources, such as 830 and 840, and the distance from the sources 830 and 840 to the substrate 105, among other parameters.

Accordingly, in such a process the first steps are providing a substrate 105 and then providing a coating chamber 810 with a PAS source 820 and at least one source 830 for forming a vapor of indium and a dopant. Another step is mounting the substrate 105 in the chamber 810 to receive the vapor of indium and the dopant. In a subsequent step the chamber 810 is evacuated to a pressure of about $2.0 \times 10^{-4}$ torr, but lower pressure can be used.

One then heats the substrate 105 to a temperature of at least about 200° C., then one proceeds to a step of energizing the PAS source, followed by vaporizing the indium and the dopant, such as by energizing source 830. As the metal vapor loses kinetic energy and condenses on the substrate 105, or subsequent layers of material already deposited thereon, it can react with the ionized oxygen formed by the self-igniting plasma from the PAS source 820. When the PAS source 820 is energized, oxygen is admitted into the chamber, depending on the vacuum system pumping capacity, the pressure will rise slightly, that is the vacuum level will decrease to some extent.

The vaporized indium and dopant condense together on the substrate 105 as a thin film 111 that comprises oxidized indium with the dopant dissolved therein at a concentration of at least about 0.5 to 5 atomic percent, but preferably about 2 atomic percent. The dopant is preferably titanium, but can also be tin, The dielectric materials, such as $MgF_2$ and $SiO_2$ and optionally a higher refractive index oxide, such as $TiO_2$ and mixtures thereof with Praseodymium, as well as tantalum dioxide or niobium oxide are deposited in a similar manner on the substrate 105 before and/or after depositing the PATCL 111, such as with source 840, which like source 830 is optionally a source for thermal evaporation, electronic beam evaporation, sputtering and the like.

TABLE IV

| Sheet Resistance for Various Process Configurations (Ω/square) | Room Temperature Deposition | Substrate heated to 280° C. |
| --- | --- | --- |
| No PAS | 73.6 | 38.1 |
| With PAS | 57.1 | 4.13 |

TABLE V

| Resistivity for Various Process Configurations (Ω-cm) | Room Temperature Deposition | Substrate heated to 280° C. |
| --- | --- | --- |
| No PAS | $30.18 \times 10^{-4}$ | $15.62 \times 10^{-4}$ |
| With PAS | $23.41 \times 10^{-4}$ | $1.69 \times 10^{-4}$ |

Figure 8:
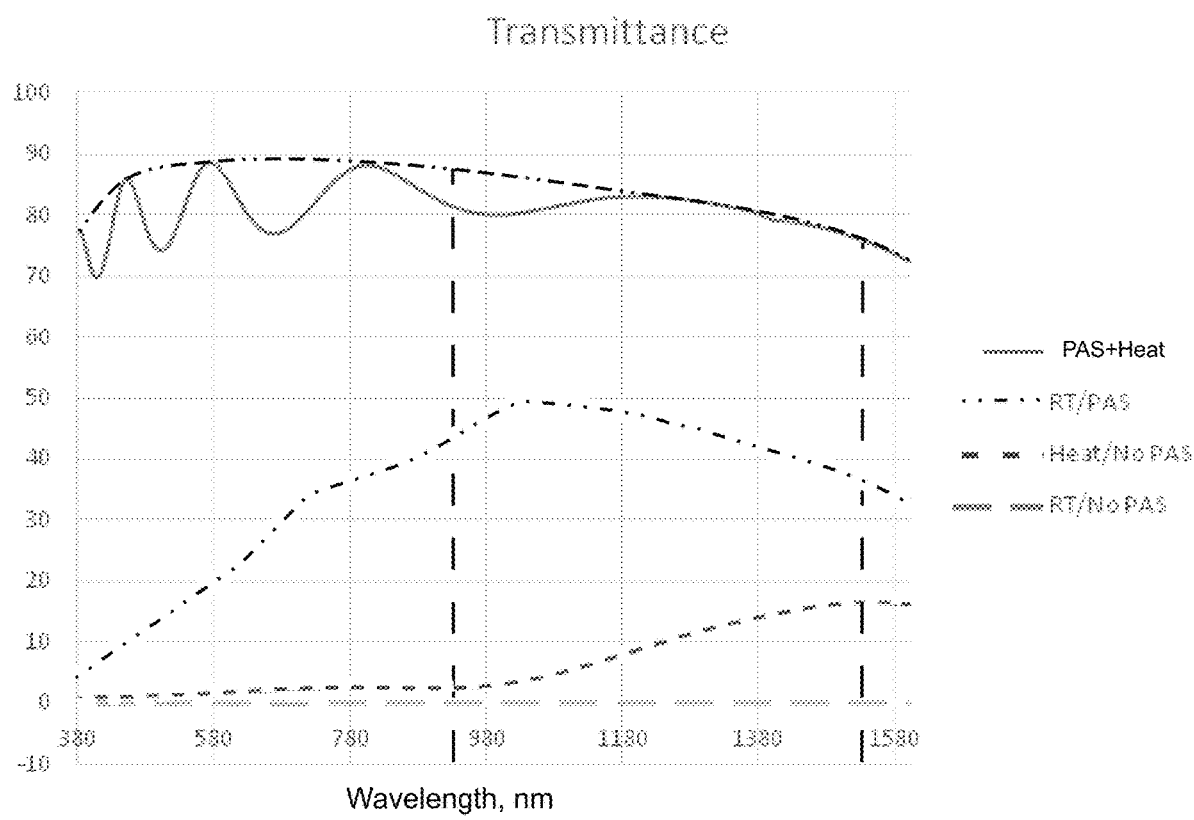
FIG. 8 is a plot of the optical transmission characteristics as a function of wavelength corresponding to the single layer films of Ti doped InO deposited under the conditions in Table IV.
Figure 9:
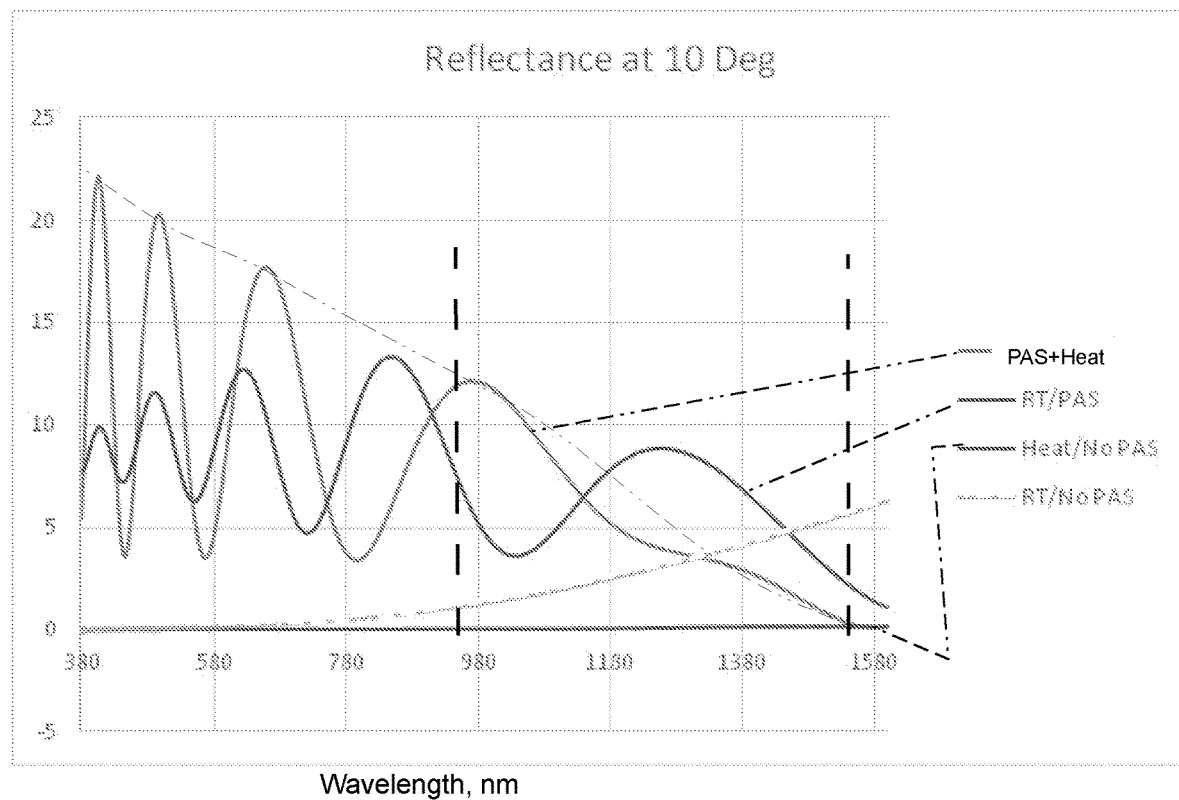
FIG. 9 is a plot of the optical reflectivity characteristics as a function of wavelength corresponding to the single layer films of Ti doped InO deposited under the conditions in Table IV.

FIGS. 8 and 9 compare the transmission and reflectivity characteristics of different single layer films deposited under the matrix of conditions in TABLE IV.

It should first be noted that only the combination of the both the activated oxygen plasma of the PAS source and the substrate heating produce the lowest resistance and the best optical transmission in the visible range and NIR.

Without the PAS source or substrate heating the film is opaque within the visible wavelength range (less than about 650 nm) and also absorbing in the NIR range useful for LIDAR applications, and likely largely metallic even though it has almost 20× the resistivity or sheet resistance compared to the thin film deposited using a combination of the PAS source with substrate heating.

Heating the substrate without energizing the PAS source resulted in some increase of transmission, but it did not exceed 15% even out to about 1500 nm. As the deposition rates remained constant in this comparison (that is at the same rate at which the energized PAS source 820 will oxidize the metallic vapor) the strongly absorption in the visible region of about 400 to 650 nm indicate the thin film is primarily metallic indium. Some limited oxidation may be occurring from the residual oxygen from the air in the chamber 810, which is a characteristic of all vacuum chambers to a greater or lesser extent.

Energizing the PAS source without heating the substrate resulted in greater thin film transmission, increasing gradually with wavelength but only reaching a peak of about 50% around 1,000 nm, and then decreasing steadily to about 35% at 1550 nm. This thin film also exhibits interference fringes in reflection as plotted in FIG. 9

However, when the substrate is heated and the PAS source is energized the transmission spectra of the thin film is significantly different, in that the transmission spectra shows interference fringes of a relatively thin film. A black dash-dash-dash-dot-dot line is provided to connect the peak values of each fringe to illustrate the general transmission characteristics of the material as a function of wavelength. The transmission reaches almost 90% at the longest visible wavelength of about 650 nm, and then slowly decreases in the NIR range, but is still above 75% at the laser emission wavelength of 1550 nm, which is more than twice the transmission that is achieved when only the PAS source is used without substrate heating. The TCO deposited under this condition also exhibits higher reflectivity at the interference fringe peaks in FIG. 9

Figure 10:
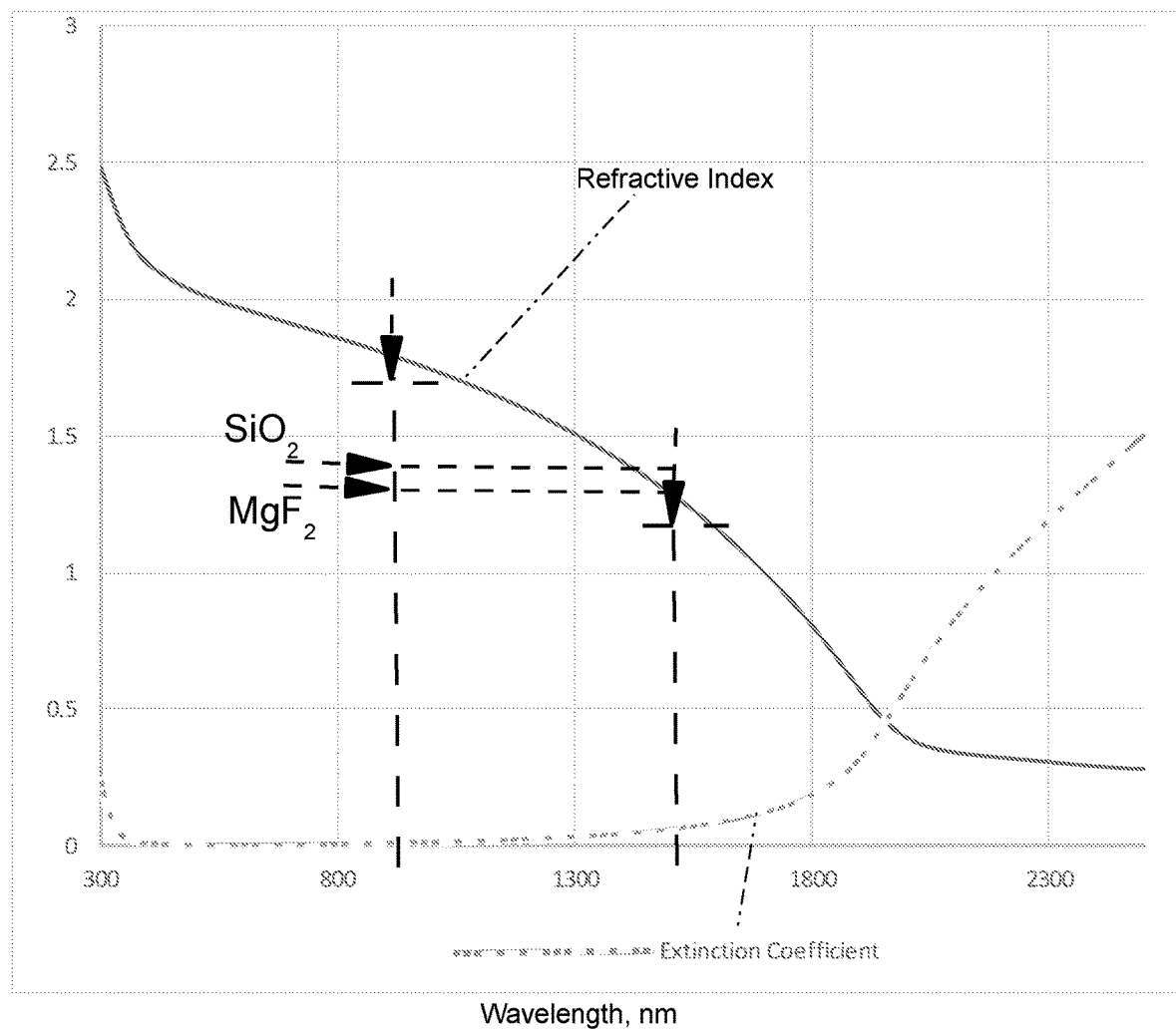
FIG. 10 is a plot of the real and imaginary components (or extinction coefficient) of the refractive index of a preferred embodiment of the Ti doped InO.

The real and imaginary components of the refractive index were then for this preferred embodiment of the TCO, deposited with the PAS energized and the substrate heated to 280° C., are plotted as a function of wavelength in FIG. 10. The gradual decrease in transmission above about 1000 nm in FIG. 8 is consistent with the slight increase in the absorption of coefficient of the TCO as plotted in FIG. 10. The vertical dashed line in FIG. 10 is positioned at the laser emission wavelength selected to optimize the optical designs in Table I-III. A pair of horizontal arrows are placed adjacent the vertical dashed lines at the refractive index values of silica or silicon dioxide ($SiO_2$) and magnesium fluoride ($MgF_2$), the typical lower refractive index materials used in optical coatings. It should now be apparent that within the range of laser emission wavelength useful for LIDAR, the refractive index and absorption coefficient for the Ti doped Indium oxide with the desired low resistance changes drastically, in that the real part of the refractive index is actually smaller than to show the complication that this PATCL can have a higher or lower retractive index at the wavelengths of interest for LIDAR application, as well as varying levels of absorptions.

In a preferred embodiment of invention, Indium and the dopant, which is preferably titanium, are vaporized by thermal evaporation each from a separate source/crucible. The dopant can be other than titanium, as for example tin, as well as any transitions metal. When the dopant is titanium, it can be present at from about 0.5 to 5 atomic percent relative to indium.

It should be appreciated that other aspects of the invention include the following variations in materials and methods that may provide opportunities for the use of different coating designs than the embodiments provided in Tables I-III.

This includes indium being vaporized by one of thermal evaporation, electronic beam evaporation and sputtering. Further, Indium and the dopant may be co-vaporized or vaporized from separate sources. The can be co-vaporized by placing an alloy of the metallic indium in the crucible or source 830, or by sputtering from an alloy target or a tiled target in which the dopant tiles form a small fraction of the racetrack that is produced by spitting away the tiles. With co-evaporated, or co-sputtering or a combination of vaporization and sputtering, the ration of the dopant to the indium in the coating is readily modified by power levels to each source, and or a different source to substrate distance in the chamber.

Post deposition annealing in a vacuum or an atmosphere with oxygen may be an alternative to heating the substrate during deposition.

It should be appreciated that the second surface 105b of the substrate 105 that form the window 100 may be coated with a second multilayer coating that does not need to contain a conductive coating layer. However, optionally one or both surface 105a and 105b may have a multilayer coating with a conductive layer.

While the invention has been described in connection with a preferred embodiment, it is not intended to limit the scope of the invention to the particular form set forth, but on the contrary, it is intended to cover such alternatives, modifications, and equivalents as may be within the spirit and scope of the invention as defined by the appended claims.

What is claimed:

1. A coated transparent substrate having a conductive multi-layer coating on at least one surface to reduce reflectance, the multi-layer coating comprising:
   a. a first partially absorbing transparent conductive layer having a first surface and a second surface opposite the first surface, wherein the first surface is disposed over a first surface of the substrate,
   b. a first dielectric layer having a first surface and a second surface opposite the first surface, wherein the first surface is disposed over the second surface of the first partially absorbing transparent conductive layer,
   c. a second partially absorbing transparent conductive layer having a first surface and a second surface opposite the first surface, wherein the first surface is disposed over the second surface of the first dielectric layer,
   d. a second dielectric layer having a first surface and a second surface opposite the first surface, wherein the first surface is disposed over the second surface of the second partially absorbing transparent conductive layer,
   e. wherein the first and second dielectric layer have a refractive index at a first wavelength between about 700 to 1700 nm that is less than about 1.45,
   f. at least one of the first and second partially absorbing transparent conductive layer is an oxide of tin and titanium in which the titanium comprises less an about 5 atomic percent of the layer,
   g. wherein at least one of the first and second partially absorbing transparent conductive layers has a real portion of the refractive index that is less than 1.8 at the first wavelength and an imaginary portion of the refractive index that is less than about 0.18 at the first wavelength,
   h. and the conductive multi-layer coating has a sheet resistance of less than 30 ohms per square.

2. The coated transparent substrate having a conductive multi-layer coating on at least one surface to reduce reflectance according to claim 1 wherein when the first wavelength is between about 700 to about 1300 nm the extinction coefficient of the partially absorbing transparent conductive layer is less than about 0.04 and real part of the refractive index thereof is greater than about 1.5.

3. A coated transparent substrate having a conductive multi-layer coating on at least one surface to reduce reflectance, the multi-layer coating comprising:
   a. a first partially absorbing transparent conductive layer having a first surface and a second surface opposite the first surface, wherein the first surface is disposed over a first surface of the substrate,
   b. a first dielectric layer having a first surface and a second surface opposite the first surface, wherein the first surface is disposed over the second surface of the first partially absorbing transparent conductive layer,
   c. a second partially absorbing transparent conductive layer having a first surface and a second surface opposite the first surface, wherein the first surface is disposed over the second surface of the first dielectric layer,
   d. a second dielectric layer having a first surface and a second surface opposite the first surface, wherein the first surface is disposed over the second surface of the second partially absorbing transparent conductive layer,
   e. wherein the first and second dielectric layer have a refractive index between about 800 to 1600 nm that is less than about 1.45, f. at least one of the first and second partially absorbing transparent conductive layer is an oxide of tin and titanium in which the titanium comprises less an about 5 atomic percent of the layer, and g. wherein the coated transparent substrate has an internal transmission at a first wavelength between about 700 to 1700 nm that is at least 90% and a reflectivity at the first wavelength that is less than 2% at between 0 to 10 degrees from normal incidence, h. wherein at least one of the first and second partially absorbing transparent conductive layers has a real portion of the refractive index that is less than 1.8 at the first wavelength and an imaginary portion of the refractive index that is less than about 0.18 at the first wavelength, and i. the conductive multi-layer coating has a sheet resistance of less than 30 ohms per square.

4. A coated transparent substrate having a conductive multi-layer coating on at least one surface to reduce reflectance, the multi-layer coating comprising:

a. at least one first partially absorbing transparent conductive layer having a first surface and a second surface opposite the first surface, wherein the first surface is disposed over a first surface of the substrate, b. a first dielectric layer having a first surface and a second surface opposite the first surface, in which the refractive index between about 800 to 1600 nm is less than about 1.45, wherein the first surface is disposed over a first surface of the substrate, c. a second dielectric coating layer having a first surface and a second surface opposite the first surface, in which the refractive index between about 800 to 1600 nm is greater than about 1.9, wherein the first surface is disposed over a first surface of the substrate, d. wherein the first partially absorbing transparent conductive layer has a real portion of the refractive index that is less than 1.8 at a first wavelength and an imaginary portion of the refractive index that is less than about 0.008 at the first wavelength, in which the first wavelength is between about 800 to 1600 nm, e. wherein the coated transparent substrate has an internal transmission at the first wavelength that is at least 90% and a reflectivity at the first wavelength that is less than 2% at between 0 to 10 degrees from normal incidence.

5. The coated transparent substrate having a conductive multi-layer coating on at least one surface to reduce reflectance according to claim 4, wherein the second dielectric coating layer is deposited on the first surface of the substrate.

6. The coated transparent substrate having a conductive multi-layer coating on at least one surface to reduce reflectance according to claim 5 wherein the first dielectric layer is deposited on the third dielectric coating layer.

7. The coated transparent substrate having a conductive multi-layer coating on at least one surface to reduce reflectance according to claim 6 further comprising one or more additional dielectric layers having a refractive index greater than about 1.9 between about 800 to 1600 nm.

8. The coated transparent substrate having a conductive multi-layer coating on at least one surface to reduce reflectance according to claim 7 wherein the partially absorbing transparent conductive layer is disposed between a pair of dielectric layers in which each dielectric layer of the pairs has a refractive index greater than about 1.9 between about 800 to 1600 nm.

9. The coated transparent substrate having a conductive multi-layer coating on at least one surface to reduce reflectance according to claim 4 wherein when the first wavelength is between about 700 to about 1300 nm the extinction coefficient of the partially absorbing transparent conductive layer is less than about 0.04 and real part of the refractive index is greater than 1.5 and the conductive multi-layer coating has a sheet resistance of less than 30 ohms per square.

10. The coated transparent substrate having a conductive multi-layer coating on at least one surface to reduce reflectance according to claim 4 wherein when the first wavelength is between about between about 1200 nm to about 1700 nm the extinction coefficient of the partially absorbing transparent conductive layer is less than about 0.18 and real part of the refractive index is greater than 0.8 and the conductive multi-layer coating has a sheet resistance of less than 30 ohms per square.

11. The coated transparent substrate having a conductive multi-layer coating on at least one surface to reduce reflectance according to claim 4 wherein when the first wavelength is between about between about 1200 nm to about 1700 nm the extinction coefficient of the partially absorbing transparent conductive layer is less than about 0.18 and real part of the refractive index thereof is greater than 0.8.

12. A process for depositing a partially absorbing transparent conductive layer on a substrate, the process comprising the steps of:

a. providing a coating chamber configured with a plasma activated source (PAS), b. mounting a substrate in the coating chamber, c. evacuating the coating chamber, d. admitting oxygen to and energizing the PAS, e. directing a vapor containing indium and a dopant at the substrate, f. wherein a partially absorbing transparent conductive layer is deposited on the substrate that has a sheet resistance of less than about 30 ohms per square and an internal transmission at a wavelength between about 700 to 1700 nm that is at least 90%.

13. The process for depositing a partially absorbing transparent conductive layer on a substrate according to claim 12 wherein the partially absorbing transparent conductive layer has an internal transmission that is at least 80% for any wavelength between about 900 nm to 1600 nm.

14. The process for depositing a partially absorbing transparent conductive layer on a substrate according to claim 12 wherein the dopant is titanium.

15. The process for depositing a partially absorbing transparent conductive layer on a substrate according to claim 12 wherein over the wavelength range of 700 to 1700 nm the partially absorbing transparent conductive layer has an extinction coefficient that is less than about 0.18 and real part of the refractive index is less than 1.8.

16. The process for depositing a partially absorbing transparent conductive layer on a substrate according to claim 12 further comprising a step of depositing at least one dielectric layer on a first portion of the partially absorbing transparent conductive layer and then deposited a second portion of the partially absorbing transparent conductive layer.

17. The process for depositing a partially absorbing transparent conductive layer on a substrate according to claim 12 further comprising a step of depositing at least one dielectric layer over the substrate before depositing the partially absorbing transparent conductive layer over the at least one dielectric layer.

18. The process for depositing a partially absorbing transparent conductive layer on a substrate according to claim 12 wherein the indium and the dopant are one of sputtered and evaporated and the substrate is heated to at least 200° C.

19. The process for depositing a partially absorbing transparent conductive layer on a substrate according to claim 12 wherein the indium and the dopant are each directed as a separate vapor from a separate source at the substrate.

20. The process for depositing a partially absorbing transparent conductive layer on a substrate according to claim 12 wherein the indium is directed as a vapor at the substrate from one of a metallic and at least partially oxidized state at the substrate.

* * * * *